United States Patent
Higashihara et al.

(10) Patent No.: US 10,032,958 B2
(45) Date of Patent: Jul. 24, 2018

(54) SEED CRYSTAL SUBSTRATES, COMPOSITE SUBSTRATES AND FUNCTIONAL DEVICES

(71) Applicant: NGK INSULATORS, LTD., Aichi-prefecture (JP)

(72) Inventors: Shuuhei Higashihara, Nagoya (JP); Makoto Iwai, Kasugai (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 24 days.

(21) Appl. No.: 14/742,798

(22) Filed: Jun. 18, 2015

(65) Prior Publication Data
US 2015/0287884 A1 Oct. 8, 2015

Related U.S. Application Data

(63) Continuation of application No. PCT/JP2013/085027, filed on Dec. 19, 2013.

(30) Foreign Application Priority Data

Dec. 20, 2012 (JP) .................. 2012-278103

(51) Int. Cl.
*H01L 33/00* (2010.01)
*H01L 33/32* (2010.01)
(Continued)

(52) U.S. Cl.
CPC .............. *H01L 33/32* (2013.01); *C30B 9/10* (2013.01); *C30B 19/02* (2013.01); *C30B 19/12* (2013.01);
(Continued)

(58) Field of Classification Search
CPC ..... H01L 33/0075; H01L 33/12; H01L 33/16; H01L 33/20; H01L 33/32; H01L 21/0237;
(Continued)

(56) References Cited

U.S. PATENT DOCUMENTS

| 2008/0163814 A1 | 7/2008 | Kim et al. |
| 2009/0197118 A1 | 8/2009 | Nagai et al. |

(Continued)

FOREIGN PATENT DOCUMENTS

| GB | 2327280 | * | 1/1999 |
| JP | 2009-018972 A | | 1/2009 |

(Continued)

OTHER PUBLICATIONS

Frentrup, M., et al., "Crystal orientation of GaN layers on (1010) m-plane sapphire," Phys. Status Solidi B. 2011;248(3):583-587.
(Continued)

*Primary Examiner* — Dale E Page
*Assistant Examiner* — Quovaunda V Jefferson
(74) *Attorney, Agent, or Firm* — Cermak Nakajima & McGowan LLP; Tomoko Nakajima

(57) ABSTRACT

A seed crystal substrate 8 includes a base body 1 and a plurality of rows of stripe-shaped seed crystal layers 3 formed on the base body 1. An upper face 3a of the seed crystal layer 3 is (11-22) plane, a groove 4 is formed between the adjacent seed crystal layers 3, and a longitudinal direction of the groove 4 is a direction in which a c-axis of a crystal forming the seed crystal layer is projected on the upper face. A nitride of a group 13 element is formed on the seed crystal substrate.

10 Claims, 7 Drawing Sheets

(51) Int. Cl.

| | | |
|---|---|---|
| *C30B 19/12* | (2006.01) | |
| *H01L 33/20* | (2010.01) | |
| *H01L 21/02* | (2006.01) | |
| *C30B 9/10* | (2006.01) | |
| *C30B 19/02* | (2006.01) | |
| *C30B 29/40* | (2006.01) | |
| *H01L 33/16* | (2010.01) | |
| *H01L 33/12* | (2010.01) | |

(52) U.S. Cl.
CPC ........ *C30B 29/406* (2013.01); *H01L 21/0237* (2013.01); *H01L 21/0254* (2013.01); *H01L 21/0262* (2013.01); *H01L 33/0075* (2013.01); *H01L 33/16* (2013.01); *H01L 33/20* (2013.01); *H01L 33/12* (2013.01)

(58) Field of Classification Search
CPC . H01L 21/0254; H01L 21/0262; C30B 19/02; C30B 19/12; C30B 9/10; C30B 29/406; C30B 19/10
See application file for complete search history.

(56) References Cited

U.S. PATENT DOCUMENTS

| | | | | |
|---|---|---|---|---|
| 2009/0316744 | A1* | 12/2009 | Obata | B82Y 20/00 372/44.011 |
| 2010/0148212 | A1* | 6/2010 | Fujito | C30B 25/20 257/103 |
| 2012/0068192 | A1 | 3/2012 | Kim et al. | |
| 2012/0111264 | A1 | 5/2012 | Shimodaira et al. | |
| 2013/0313567 | A1 | 11/2013 | Furuya et al. | |

FOREIGN PATENT DOCUMENTS

| | | |
|---|---|---|
| JP | 2009-018975 A | 1/2009 |
| JP | 2010-512301 A | 4/2010 |
| JP | 2010-163288 A | 7/2010 |
| JP | 2012-037153 A | 8/2010 |
| JP | 4793132 B2 | 8/2011 |
| JP | 4908467 B2 | 1/2012 |
| JP | 4935700 B2 | 3/2012 |
| WO | WO2011/004904 A1 | 1/2011 |
| WO | WO2012/121154 A1 | 9/2012 |

OTHER PUBLICATIONS

Imer, B. M., et al., "Improved quality (1120) a-plane GaN with sidewall lateral epitaxial overgrowth," Appl. Phys. Lett. 88, 061908 (2006).
Lacroix, B., et al., "Efficient blocking of planar defects by prismatic stacking faults in semipolar (1122)-GaN layers on m-sapphire by epitaxial lateral overgrowth," Appl. Phys. Lett. 98, 121916 (2011).
International Search Report and Written Opinion for PCT Patent App. No. PCT/JP2013/085027 (dated Feb. 10, 2014) with partial English translation.
International Preliminary Report on Patentability for PCT Patent App. No. PCT/ JP2013/085027 (dated Jul. 2, 2015).

\* cited by examiner

SEED CRYSTAL SUBSTRATES, COMPOSITE SUBSTRATES AND FUNCTIONAL DEVICES

TECHNICAL FIELD OF THE INVENTION

The present invention relates to a composite substrate including a nitride of a group 13 element such as gallium nitride crystal layer, and a functional device utilizing the same.

BACKGROUND ARTS

According to a method of forming a film of a gallium nitride crystal layer by vapor phase process, it is difficult to bent dislocations accompanied with crystal growth. It is thus difficult to reduce the dislocations, without forced reduction of the dislocations such as ELO on the surface of seed crystal or growth using a PSS sapphire.

On the other hand, according to Na flux method, dislocations in the seed crystal substrate are succeeded by gallium nitride crystal film formed thereon. However, as the crystal growth, edge dislocations are bent and concentrated to reduce the dislocation density. It is thus possible to improve the crystal quality of the upper gallium nitride crystal than that of the seed crystal substrate, without the formed reduction of the dislocations.

To the date, it has been proposed and developed many kinds of techniques of forming a film of gallium nitride by flux method or the like on a c-plane (polarized plane) of a seed crystal substrate, and it is obtained gallium nitride crystal having a low dislocation density stably. However, it has not been developed a method of forming a film of gallium nitride on a non-polar seed crystal substrate, and its practical application is strongly demanded.

It is proposed a method of forming a self-supporting substrate by forming many stripe-shaped seed crystal layers on a seed crystal substrate to reduce defects in a gallium nitride crystal layer formed thereon and by spontaneously separating the gallium nitride crystal layer (Patent document 1 (Japanese Patent publication No. 2010-163288A): Patent document 2 (Japanese Patent Publication No. 2009-018975A): Patent document 3 (Japanese Patent Publication No. 2009-018972A): Patent document 4 (WO 2011/004904 A1)). It is, however, to form a film of gallium nitride on a polarized plane (c-plane) of the seed crystal substrate and to utilize ELO (Epitaxial lateral growth).

On the other hand, in the case that gallium nitride crystal is formed on the non-polar seed crystal layer, as techniques of reducing defects characteristic to the non-polar one, it may be listed Patent document 5 (Japanese Patent No. 4908467B), Patent document 6 (Japanese Patent No. 4793132B), Patent document 7 (Japanese Patent No. 4935700B), Patent document 8 (Japanese Patent Publication No. 2012-037153A), Patent document 9 (WO 2012/121154 A), Non-patent document 1 (Appli. Phys. Lett. 88., 061908), Non-patent document 2 (Appl. Phys. Lett. 98., 121916) or the like.

PRIOR DOCUMENTS

Patent document 1: Japanese Patent publication No. 2010-163288A
Patent document 2: Japanese Patent Publication No. 2009-018975A
Patent document 3: Japanese Patent Publication No. 2009-018972A
Patent document 4: WO 2011/004904 A1
Patent document 5: Japanese Patent No. 4908467B
Patent document 6: Japanese Patent No. 4793132B
Patent document 7: Japanese Patent No. 4935700B
Patent document 8: Japanese Patent Publication No. 2012-037153A
Patent document 9: WO 2012/121154 A
Non-patent document 1: Appl. Phys. Lett. 88., 061908 (2006)
Non-patent document 2: Appl. Phys. Lett. 98., 121916 (2011)

SUMMARY OF THE INVENTION

The inventors have studied to utilize a low-dislocation GaN template produced by flux method and to form a film structure by MOCVD method for realizing functions as LED or a power device. The GaN template substrate means a substrate including a seed crystal layer and gallium nitride crystal layer formed thereon, and providing a template for further forming functional layers thereon.

Particularly in this case, it is demanded to form gallium nitride crystal on the non-polar GaN template.

However, in the case that a crystal layer of a nitride of a group 13 element is grown by flux method on the non-polar plane, that is (11-22) plane, of the seed crystal, it was observed the phenomenon that many voids are laminated in layers in the crystal layer of the nitride of group 13 element. Such phenomenon was proved to be considerable in the first time in the case of the liquid phase process and unknown, and the phenomenon was not observed in the case that the crystal layer of the nitride of group 13 element is formed on the c-plane of the seed crystal layer.

An object of the present invention is, in forming a film of a nitride of a group 13 element on a non-polar seed crystal substrate whose growing surface is (11-22) plane, to reduce defects of the nitride of the group 13 element and to prevent generation of the laminar voids.

The present invention provides a composite substrate comprising a seed crystal substrate and a layer of a crystal of a nitride of a group 13 element grown on the seed crystal substrate and the seed crystal substrate comprises a base body and a plurality of rows of stripe-shaped seed crystal layers formed on the base body. An upper face of the seed crystal layer is (11-22) plane, a groove is formed between the adjacent seed crystal layers, and the longitudinal direction of the groove is a direction in which a c-axis of a crystal forming the seed crystal layer is projected on the upper face.

The present invention further provides a seed crystal substrate comprising a base body and a plurality of rows of stripe-shaped seed crystal layers formed on the base body. An upper face of the seed crystal layer is (11-22) plane, a groove is formed between the adjacent seed crystal layers, and the longitudinal direction of the groove is a direction in which a c-axis of a crystal forming the seed crystal layer is projected on the upper face.

The present invention further provides a functional device comprising the composite substrate and a functional layer. The functional layer is formed on the layer of the crystal of the nitride of the group 13 element by vapor phase process and composed of a nitride of a group 13 element.

In forming a film of a nitride of a group 13 element on a non-polar seed crystal substrate whose growth face is (11-22) plane, it was studied the cause of generation of the laminar voids as described above.

That is, in the case that the growth face is flat, the growth of crystal starts from many nucleation sites on the growth face. It is considered that the nucleation sites are randomly distributed on the growth face. On the other hand, it is considered that crystals generated from the adjacent nucleation sites are associated with each other along the a-axis of the crystal. As the nucleation sites are randomly distributed, the association points are also randomly distributed to result in the association at the m-planes. It is considered that, as a result, the crystals grown from the adjacent nucleation sites are incompletely associated with each other in the [−1-123] direction to generate many voids.

Based on such assumption, the inventors reached the idea of, in growing a nitride of a group 13 element on a non-polar seed crystal substrate whose growth face is (11-22) plane, forming grooves each extending in a direction in which the c-axis is projected on an upper face of the seed crystal layer. Stripe-shaped seed crystal films are formed on both sides of the groove.

The m-plane of the seed crystal layers on both sides of the groove is thereby exposed to the groove. As the nitride of the group 13 element is epitaxially grown thereon, the m-plane of the seed crystal layer provides starting sites of the nucleation and growth, so that the crystals grown from the respective starting points tend to be associated with each other in the direction of the c-axis. As such, the association of the crystals grown from the respective nucleation sites is predominantly and orderly progressed in the direction of the c-axis, it is possible to reduce the voids in the nitride of the group 13 element, to reduce the defect density and to obtain an excellent composite substrate.

MODES FOR CARRYING OUT THE INVENTION

The present invention will be described further in detail below, with reference to the accompanying drawings.

Figure 1A:
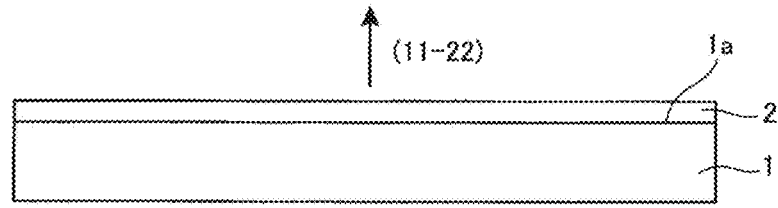
FIG. 1(a) is a view schematically showing a seed crystal substrate before forming grooves.

As shown in FIG. 1(a), a seed crystal layer 2 is formed on a growth face 1a of a base body 1. It this case, it is possible to further form an underlying layer or stress-relaxing layer between the seed crystal layer 2 and base body 1. Further, the growth face 1a is orientated to be (11-22) plane of crystal forming the base body. That is, the seed crystal substrate is made non-polar.

Figure 1B:
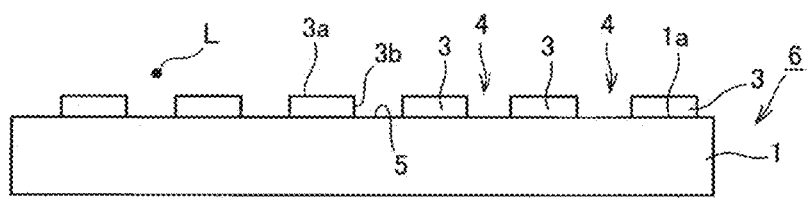
FIG. 1(b) is a view schematically showing a seed crystal substrate 6 after forming the grooves.
Figure 1C:
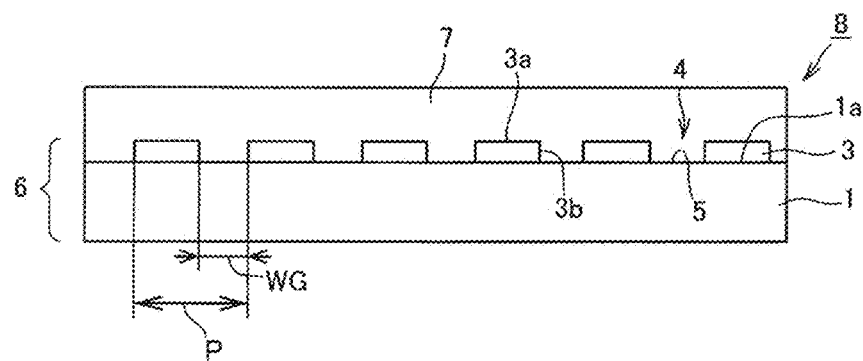
FIG. 1(c) is a view showing a composite substrate 8.

Then, as shown in FIG. 1(b), the seed crystal layer 2 is processed to form a plurality of grooves 4. Stripe-shaped seed crystal layers 3 are formed on both sides of each groove 4. This is made a seed crystal substrate 6. On the seed crystal substrate 6, as shown in FIG. 1(c), a layer 7 of a crystal of a nitride of a group 13 element is formed to obtain a composite substrate 8.

Figure 2A:
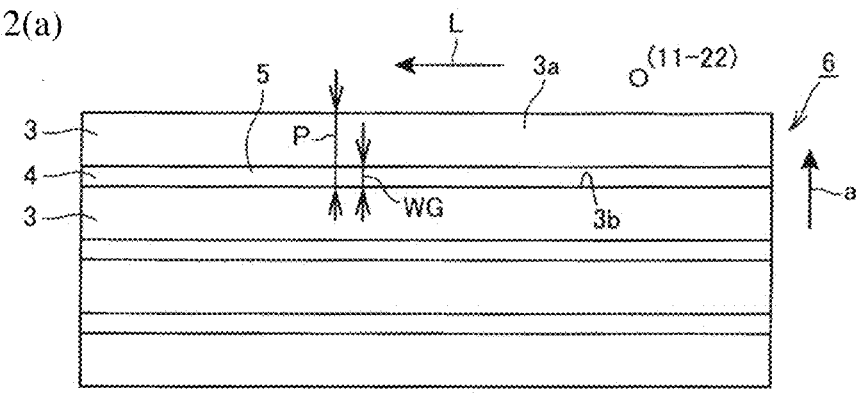
FIG. 2(a) is a plan view showing the seed crystal substrate 6 of FIG. 1(b)
Figure 2B:
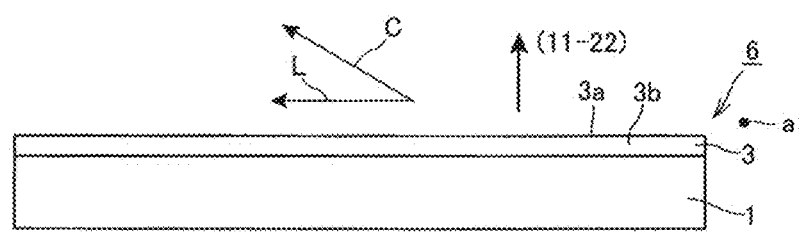
FIG. 2(b) is a side view showing the seed crystal substrate 6.

According to the composite substrate 6, as shown in FIGS. 2(a) and 2(b), a plurality of rows of the grooves 4 are formed. Each groove 4 is elongated in a direction L in which c-axis is projected on an upper face 3a. That is, the longitudinal direction of each groove 4 is made the direction L in which the c-axis is projected on the upper face 3. Further, the stripe-shaped seed crystal layers 3 are formed on the both sides of each groove 4. As a result, each of the seed crystal layers 3 is also elongated in the direction L in which the c-axis is projected on the upper face 3. In other words, the longitudinal direction of the groove is made the direction [−1-123] direction) in which the c-axis ([0001] direction) is projected on the upper face of the seed crystal layer. As a result, side faces 3b of each seed crystal layer 3 facing the groove 4 are made a plane. Besides, 5 represents an exposed face of the base body 1 to the groove 4.

A nitride of a group 13 element is epitaxially grown on the seed crystal substrate 6 so that nucleation sites are generated on both of the upper face 3a and side faces 3b of the seed crystal layer 3.

Figure 2C:
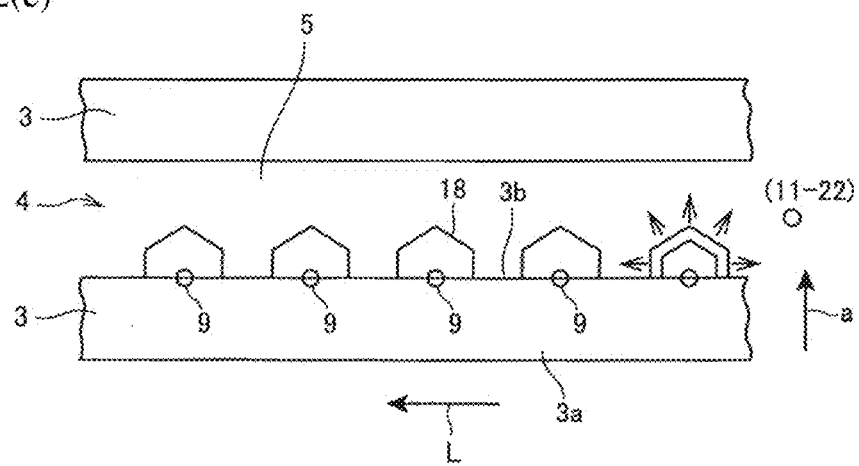
FIG. 2(c) is a diagram for schematically illustrating crystal growth.

Here, particularly as shown in FIG. 2(c), the nucleation sites 9 on the side face 3b are arranged in a series along the groove 4. As the same time, as the side face 3b is made a-plane, crystals 18 grown from the respective nucleation sites 9 tend to be associated in the direction of the c-axis and continuous with each other. As the association in the direction of the c-axis occurs regularly as described above, the laminar voids do not tend to occur and the defects remaining in the thus obtained crystal are reduced.

Besides, techniques such as SELO have been known as prior techniques. However, SELO is a technique that grooves are formed on m-face of a crystal to make side faces of stripe-shaped seed crystal layers c-plane and crystal is grown predominantly from the c-plane to obtain a semipolar plane. Therefore, for limiting the growth starting from the c-plane, the starting points of the crystal growth from planes other than the growth face is prevented, for example by masking surfaces other than the c-plane. However, the plane of the starting sites of the growth is the c-plane, whose direction of the starting site of growth is different from that of the present patent. Further, according to flux method, the growth is facilitated in the direction, such as a-plane, perpendicular to the c-plane, so that euhedral form of the crystal appears on the surface to provide bellow-like morphology, which is not parallel with the main face.

Figure 3A:
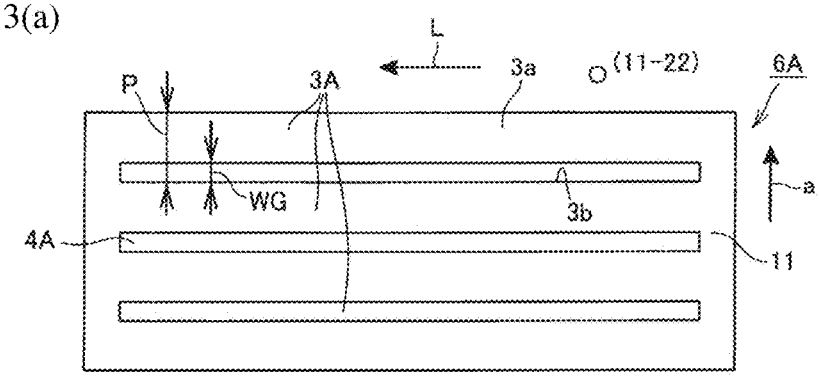
FIG. 3(a) is a plan view showing a seed crystal substrate 6A according to another embodiment.
Figure 3B:
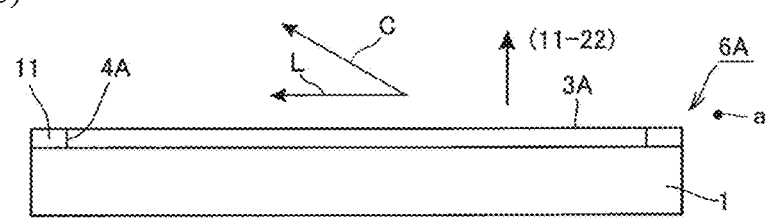
FIG. 3(b) is a side view of the seed crystal substrate 6A.

Besides, the stripe-shaped seed crystal layers may be separated from each other as shown in FIG. 2, or may be connected with each other as shown in FIG. 3. That is, according to examples of FIGS. 3(a) and 3(b), a plurality of rows of seed crystal layers 3A is arranged and the grooves 4 described above are formed between the adjacent seed crystal layers 3A. However, according to the present example, connecting portions 11 are further provided at the ends of the respective grooves so that the adjacent seed crystal layers 3A are connected with each other through the connecting portion 11. The connecting portions 11 are formed simultaneously with the seed crystal layers 3A.

According to the present invention, the upper face 3a of the seed crystal layer is (11-22) plane, and the longitudinal direction L of the groove 5 is the direction in which the c-axis of the crystal forming the seed crystal layer is projected on the upper face.

Figure 5:
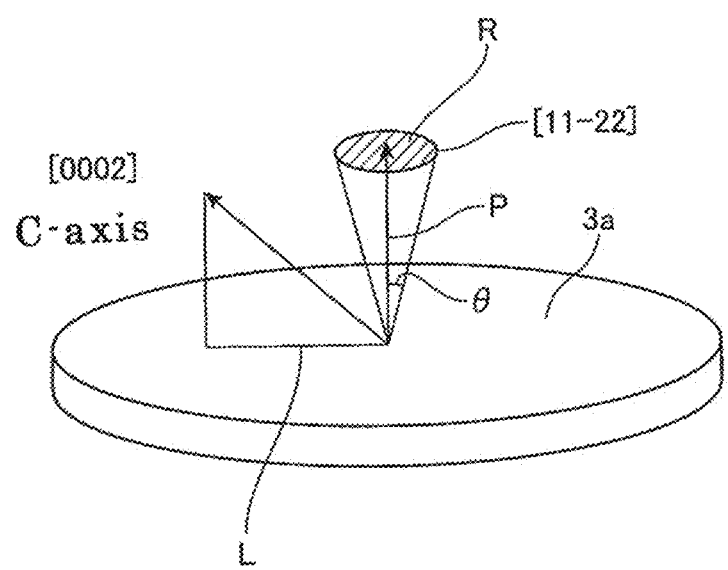
FIG. 5 is a diagram schematically showing the relationship of a normal line P of an upper face and crystal orientations.

Here, as shown in FIG. 5, the c-axis ([0002] orientation) and [11-22] orientation intersect at an angle of 56°. As the upper face 3a of the seed crystal layer is (11-22) plane, although it is included that the normal line P of the upper face 3a is identical with the [11-22] orientation in strictly geometrical meaning, it is not demanded that the normal line P of the upper face 3a is identical with the [11-22] orientation in strictly geometrical meaning. According to the present invention, it is permitted that the normal line P of the upper face 3a is slightly inclined from [11-22] orientation to provide an offcut angle, for improving quality of crystal grown on the substrate. The offcut angle θ may preferably be in a range within ±0.5°. In this case, [11-22] orientation is present in a range of a region R inclined with respect to the normal line P as the center by the offcut angle θ or less. The direction of the offcut angle may preferably be provided in [−1-123] orientation, [1-100] orientation, or a direction of synthesized vector of [−1-123] and [1-100] orientations.

Therefore, according to the present invention, the angle of the normal line P of the upper face 3a and the c-axis is 56°±(0° ~θ)(preferably, 56°±(0°~0.5°).

Elements of the present invention will be described further below.

(Base Body)

According to the present invention, the base body is not particularly limited, as far as it is possible to grow a nitride of a group 13 element thereon. It may be listed sapphire, silicon single crystal, α-SiC single crystal, MgO single crystal, spinel ($MgAl_2O_4$), $LiAlO_2$, $LiGaO_2$ or the like.

According to the viewpoint of the present invention, for preventing the separation of the crystal layer of the nitride of the group 13 element, the thickness of the base body may preferably be made thicker than that of the crystal layer of the nitride of the group 13 element. For this, the thickness of the base body may preferably be made 200 to 2000 μm and more preferably be 300 to 1000 μm.

(Underlying Layer)

An underlying layer may be formed between the base body and seed crystal layer if appropriate. The method of forming the underlying layer is vapor phase epitaxy method including metal organic chemical vapor deposition (MOCVD) method, hydrid vapor phase epitaxy method, MBE method and sublimation method.

Although the thickness of the underlying layer is not particularly limited, it may preferably be 0.01 μm or larger and more preferably be 0.1 μm or larger. Further, in the case that it is too thick, it would take a long time for the film formation to reduce the efficiency, so that it may preferably be 3.0 μm or smaller and more preferably be 1.5 μm or smaller. Further, the material of the underlying layer may preferably be a nitride of a group 13 element as described later.

(Seed Crystal Layer)

The seed crystal layer may be composed of a single layer or a plurality of layers. Further, the method of forming the seed crystal layer may be vapor phase epitaxy method as a preferred example, and it includes metal organic chemical vapor deposition (MOCVD) method, hydrid vapor phase epitaxy (HYPE) method, pulse excited deposition (PXD) method, MBE method and sublimation method. Metal organic chemical vapor deposition method is particularly preferred.

The dislocation density of the seed crystal layer may preferably be lower, on the viewpoint of reducing the dislocation density of the nitride of the group 13 element provided on the seed crystal layer. On the viewpoint, the dislocation density of the seed crystal layer may preferably be $7 \times 10^8$ cm$^{-2}$ or lower and more preferably be $5 \times 10^8$ cm$^{-2}$ or lower. Further, as the dislocation density of the seed crystal layer may preferably be lower on the viewpoint of quality, the lower limit is not particularly defined, and it may generally be $5 \times 10^7$ cm$^{-2}$ or higher in many cases.

The material of the seed crystal layer is a nitride of a group 13 element. The nitride of the group 13 element will be described later.

According to the present invention, the seed crystal layer has a shape of a stripe and a groove is formed between them. The method of processing them includes dry etching, wet etching, mechanical processing or the like.

Further, on the viewpoint of preventing the voids and reducing defects, the width WG of the groove 4 (refer to FIG. 2(a) and FIG. 3(a)) may preferably be 0.1 μm or larger, more preferably be 0.3 μm or larger and most preferably be 0.5 μm or larger. Further, the width WG of the groove 4 may preferably be 200 μm or smaller, more preferably be 50 μm or smaller, even more preferably be 30 μm or smaller and most preferably be 5 μm or smaller, on the viewpoint of over growth.

Further, on the viewpoint of preventing the voids and reducing defects, the period P of arrangement of the grooves 4 may preferably be 0.5 μm or larger, more preferably be 1 μm or larger, even more preferably be 5 μm or larger and most preferably be 10 μm or larger. Further, the period P of arrangement of the grooves 4 may preferably be 3200 μm or smaller, more preferably be 2000 μm or smaller, even more preferably be 300 μm or smaller and most preferably be 100 μm or smaller. Besides, the period of arrangement of the grooves 4 is a total of the width WG of the single groove 4 and the width of the stripe-shaped seed crystal layer adjacent to it.

Besides, by making the longitudinal direction of the groove [10-10] orientation perpendicular to the direction in which [0001] orientation is projected on the surface of the base body, it is also possible to reduce the defects in the nitride of the group 13 element formed on the seed crystal layer. However, by forming such grooves, the voids as described above tend to be generated. It is thus preferred that such grooves are fewer and more preferably are not present.

(Layer of Crystal of Nitride of Group 13 Element)

According to the present invention, if the crystal layer of the nitride of the group 13 element and base body are spontaneously separated, it cannot be used as a composite substrate. Here, the thickness (thickness at the time of film formation) at a valley part of bellow-like shape appeared on the surface of the crystal layer of the nitride of the group 13 element may preferably be made 300 μm or smaller, so that the spontaneous separation of the crystal layer of the nitride of the group 13 element from the base body is prevented. On the viewpoint, the minimum thickness of the crystal layer of the nitride of the group 13 element may preferably be 200 μm or smaller, more preferably be 100 μm or smaller and more preferably be 50 μm or smaller.

Further, the thickness of the crystal layer of the nitride of the group 13 element may preferably be 5 μm or larger and more preferably be 10 μm or larger, on the viewpoint of diminishing the dislocations of the seed crystal layer during the crystal growth by flux method to make the crystallinity of the uppermost surface excellent.

Further, by polishing the surface of the crystal layer of the nitride of the group 13 element, it is possible to further improve the quality of the functional layer thereon. The method of polishing includes polishing with diamond, CMP and dry etching, for example.

Further, the thickness of the crystal layer of the nitride of the group 13 element after the polishing may preferably be 200 μm or smaller and more preferably be 50 μm or smaller.

Figure 4A:
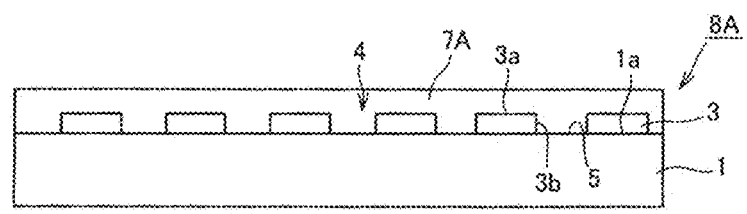
FIG. 4(a) is a view showing a composite substrate 8A after a layer of a crystal of a group 13 nitride is polished.

For example, as shown in FIG. 4(a), the crystal layer of the nitride of the group 13 element may be polished to form the polished gallium nitride crystal layer 7A to provide a composite substrate 8A.

Single crystal referred to in the present specification is defined as follows. Although single crystal includes typical single crystals where atoms are regularly arranged throughout the whole of the crystal, it is not limited to such typical ones and includes those generally referred to in the Industries. That is, single crystal may include a some degree of defects, or may include internal stress, or may contain impurities, and includes those called single crystal which is distinguishable from polycrystals (ceramics).

Wurtzite structure of the single crystal of the nitride of the group 13 element has m-plane, c-plane and a-plane. Each of these crystal planes is crystallographically defined.

The group 13 element means group 13 element according to the Periodic Table determined by IUPAC. The group 13 element is specifically gallium, aluminum, indium, thallium or the like. Further, as an additive, it may be listed carbon, a metal having a low melting point (tin, bismuth, silver, gold), and a metal having a high melting point (a transition metal such as iron, manganese, titanium, chromium etc.). The metal having a low melting point may be added for preventing oxidation of sodium, and the metal having a high melting point may be incorporated from a container for containing a crucible, a heater of a growing furnace or the like. The nitride of the group 13 element may particularly preferably be GaN, AlN or GaAlN.

The crystal layer of the nitride of the group 13 element may be grown by flux method. On this occasion, as long as the nitride of the group 13 element can be generated, a type of the flux is not particularly limited. In a preferred embodiment, flux containing at least one of an alkaline metal and an alkaline-earth metal is used, and the flux containing sodium metal may be particularly preferably used.

As to the flux, raw material such as gallium is mixed and used. As such gallium raw material, gallium single metal, a gallium alloy or a gallium compound may be used. In terms of handling, gallium single metal may be used preferably. As aluminum or indium raw material, aluminum or indium single metal, an aluminum or indium alloy or an aluminum or indium compound may be used. In terms of handling, aluminum single metal or indium single metal may be used preferably.

The growth temperature of the nitride crystal of the group 13 element in the flux method and the holding time during the growth are not particularly limited, and they are appropriately changed in accordance with a composition of the flux. As an example, when the crystal is grown using a flux containing sodium, the growth temperature may be preferably set at 800° C. to 950° C., and more preferably set at 850 to 900° C.

By the flux method, a single crystal is grown in an atmosphere of nitrogen-containing gas. For this gas, nitrogen gas may be preferably used, and ammonia may be used. The total pressure of the atmosphere is not particularly limited; but it may be preferably set at 10 atm or more, and further preferably 30 atm or more, from the standpoint of prevention against the evaporation of the flux. However, as the pressure is higher, an apparatus becomes larger. Therefore, the total pressure of the atmosphere may be preferably set at 2000 atm or less, and further preferably 500 atm or less. Any other gas except the nitrogen-containing gas in the atmosphere is not limited; but an inert gas may be preferably used, and argon, helium, or neon may be particularly preferably used.

(Functional Layer)

Figure 4B:
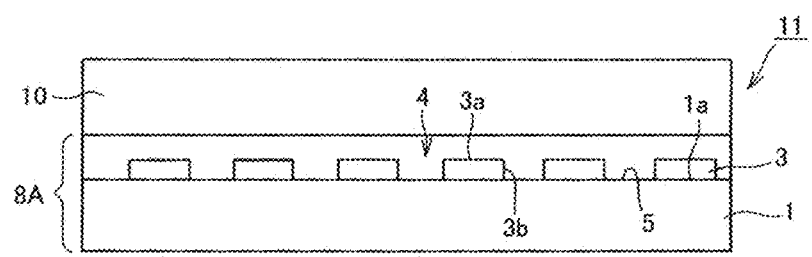
FIG. 4(b) is a view showing a functional device 11 after a functional layer 10 is formed on the composite substrate 8A.
Figure 4C:
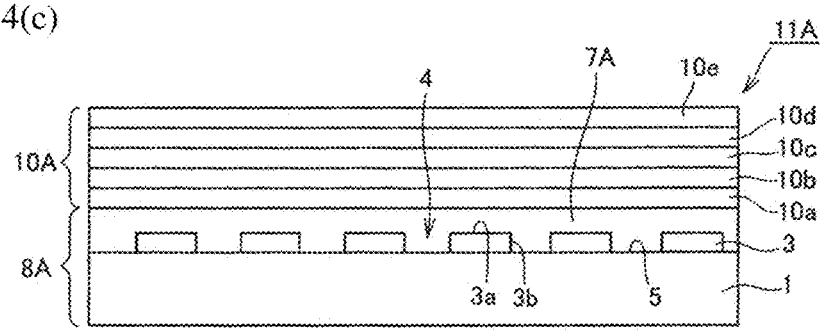
FIG. 4(c) is a view showing a functional device 11A after a functional layer 10A is formed on the composite substrate 8A.

A functional layer may be further formed on the composite substrate to obtain a functional device. For example, as shown in FIG. 4(b), a functional layer 10 is formed on a composite substrate 8A to obtain a functional device 11. Here, a plurality of the functional layers 10 may be formed. For example, according to an embodiment of FIG. 4(c), it is formed a light emitting device structure 10A. it is thus possible to obtain a light emitting device structure having a small dislocation density so that the internal quantum efficiency of the light emitting device 11A can be improved.

The light emitting device structure 10A includes an n-type semiconductor layer, a light emitting region provided on the n-type semiconductor layer and a p-type semiconductor layer provided on the light emitting region, for example. According to the light emitting device 11A of FIG. 4(c), on a crystal layer 7A of a nitride of a group 13 element, an n-type contact layer 10a, an n-type clad layer 10b, an active layer 10c, a p-type clad layer 10d and p-type contact layer 10e are formed to provide the light emitting device structure 10A.

Such functional layer may be composed of a single layer or a plurality of layers. Further, as the function, it may be used for a white LED with improved brightness and color rendering index, a blue-violet laser disk for high-speed and high-density optical memory, and a power device for an inverter for a hybrid car or the like.

In the case that a semiconductor light emitting diode (LED) is produced on the composite substrate by vapor phase epitaxy process, preferably organic metal chemical vapor deposition (MOCVD) method, the dislocation density inside of the LED becomes comparable with that of the composite substrate.

The film-forming temperature of forming the functional layer may preferably be 950° C. or higher and more preferably be 1000° C. or higher, on the viewpoint of the speed of the film formation. Further, on the viewpoint of preventing cracks, the film-forming temperature of the functional layer may preferably be 1200° C. or lower and more preferably be 1150° C. or lower.

The material of the functional layer may preferably be a nitride of a group 13 element. The group 13 element means group 13 element according to the Periodic Table determined by IUPAC. The group 13 element is specifically gallium, aluminum, indium, thallium or the like. Further, as an additive, it may be listed carbon, a metal having a low melting point (tin, bismuth, silver, gold), and a metal having a high melting point (a transition metal such as iron, manganese, titanium, chromium etc.). The metal having a low melting point may be added for preventing oxidation of sodium, and the metal having a high melting point may be incorporated from a container for containing a crucible, a heater of a growing furnace or the like.

EXAMPLES

Example 1

A composite substrate 8A was produced as described referring to FIGS. 1, 2 and 4(a).

(Production of Seed Crystal Substrate)

Specifically, it was prepared a GaN template substrate having a main face which is (11-22) plane. That is, a c-face substrate 1 of sapphire single crystal having a diameter of 4 inches was contained in an MOCVD furnace (Metal Organic Vapor Phase Epitaxy furnace), and heated at 1150° C. for 10 minutes in hydrogen atmosphere to preform cleaning of the surface. Then, the temperature of the substrate was lowered to 500° C., and TMG (trimethyl gallium) and ammonia were used as raw materials to grow a gallium nitride layer to a thickness of 30 nm. Then, the temperature of the substrate was elevated to 1080° C., and TMG and ammonia were used as raw materials to grow a gallium nitride layer to a thickness of 3 μm to form a seed crystal layer 2.

Then, an SiO$_2$ mask patterned with photolithography was applied onto the thus obtained substrate, and RIE (reactive ion etching) was performed to form grooves 4 and stipe-shaped seed crystal layers 3 to obtain a seed crystal substrate 6. The width WG of the groove 4 was made 5 μm, the width of the seed crystal layer was 45 μm and the period P of formation of the grooves 4 was 50 μm. The groove was communicated from one end to the other end of the wafer.

(Flux Method)

On the seed crystal substrate 6, a gallium nitride crystal layer 7 was grown by Na flux method. Raw materials for the growth were gallium metal, sodium metal and lithium metal. 30 g of gallium metal, 40 g of sodium metal and 30 mg of lithium metal were filled in an alumina crucible, respectively, and gallium nitride single crystal was grown for about 50 hours under nitrogen atmosphere at a furnace temperature of 850° C. and pressure of 4.0 MPa. After the reaction, it was cooled to room temperature and the flux was removed by the reaction with ethanol. As a result, it was grown colorless and transparent crystal having thicknesses of 268 μm at its mountain part and 250 μm at its valley part of the bellow shape. It was subjected to polishing and its surface was observed by a microscope to prove that voids were not generated on the polished surface. Further, the in-plane distribution of the dislocation density was measured by CL to prove to be 7 to $8 \times 10^5$ cm$^{-2}$ in average.

Figure 6:
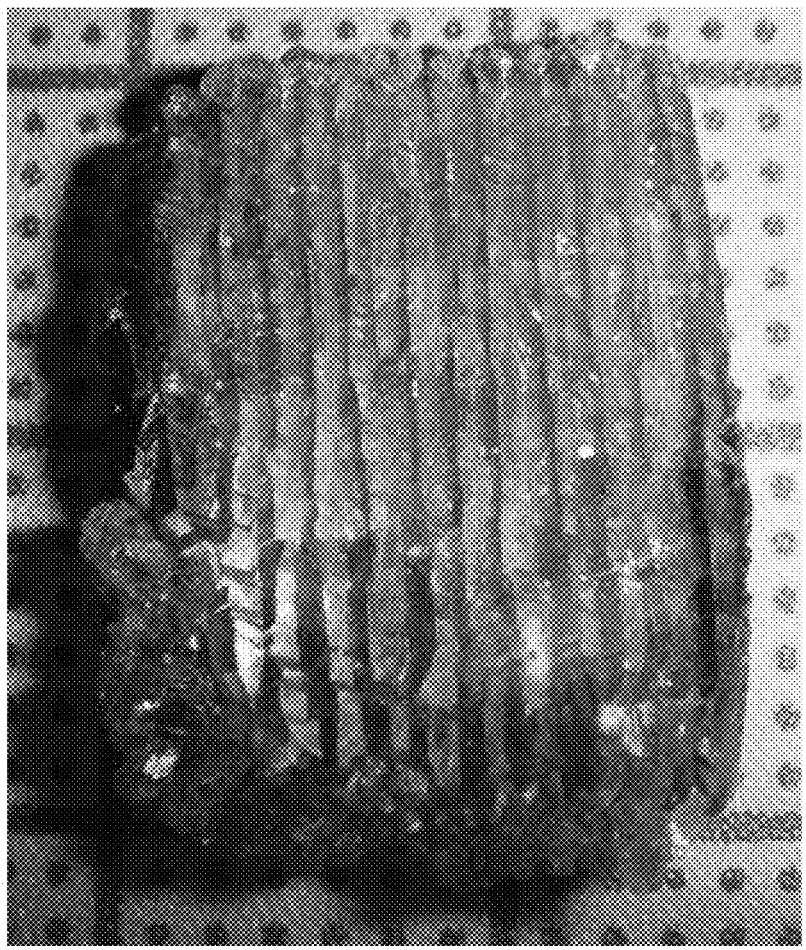
FIG. 6 is a photograph showing appearance of a nitride of a group 13 element obtained in the example.
Figure 7:
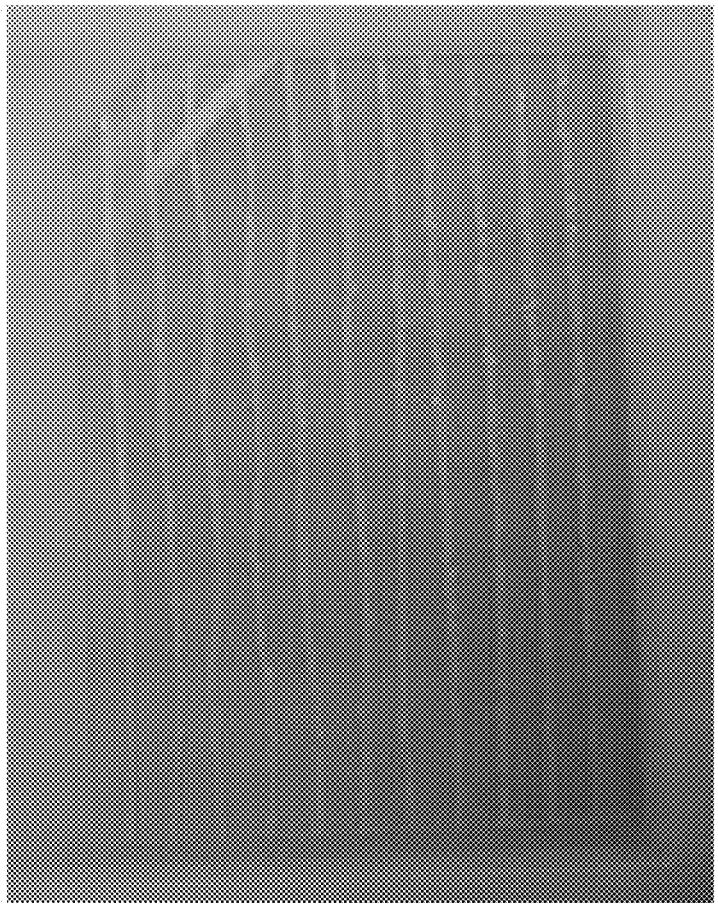
FIG. 7 is a photograph showing patterns of stripe-shaped seed crystal layers and grooves formed in the example.

Besides, FIG. 6 is a photograph showing appearance of a nitride of a group 13 element obtained by the present example, and FIG. 7 is a photograph showing patterns of the stripe-shaped seed crystal layers and grooves formed in the present example.

Example 2

The composite substrate was produced according to the same procedure as the Example 1. However, different from the Example 1, the width WG of the groove was made 30 μm, the width of the seed crystal layer was made 100 μm, and the period of arrangement of the grooves was made 130 μm. As a result, it was obtained colorless and transparent gallium nitride crystal layer having thicknesses of 302 μm at the mountain part and 220 μm at the valley part of the bellow shape.

It was subjected to polishing and its surface was observed by a microscope to prove that voids were not generated on the polished surface. Further, the in-plane distribution of the dislocation density was measured by CL to prove to be 8 to $9 \times 10^5$ cm$^{-2}$ in average.

Comparative Example 1

The composite substrate was produced according to the same procedure as the Example 1. However, different from the Example 1, the seed crystal substrate shown in FIG. 1(a) was subjected to flux method, and the grooves 4 were not formed in the seed crystal layer 2. As a result, it was obtained colorless and transparent gallium nitride crystal having thicknesses of 290 μm at the mountain part and 252 μm at the valley part.

However, as the crystal was subjected to polishing and its surface was observed by a microscope, voids were irregularly generated on the polished surface. As a result of observation of the cross section, it was confirmed that the generated voids were elongated from the interface between the seed crystal substrate and gallium nitride layer in [0001] direction. Further, even in the case that the thickness of the polishing was changed, it could not be obtained the polished surface without the voids. Further, the in-plane distribution of the dislocation density was measured by CL to prove to be $2 \times 10^5$ to $7 \times 10^6$ cm$^{-2}$ and the distribution was large.

Example 3

The composite substrate was produced according to the same procedure as the Example 1. However, different from the Example 1, the width WG of the groove was made 30 μm, the width of the seed crystal layer was made 1000 μm, and the period of arrangement of the grooves was made 1030 μm. As a result, it was obtained colorless and transparent gallium nitride crystal layer having thicknesses of 1070 μm at the mountain part and 211 μm at the valley part of the bellow shape.

It was subjected to polishing and its surface was observed by a microscope to prove that voids were not generated on the polished surface. Further, the in-plane distribution of the dislocation density was measured by CL to prove to be 10 to $15 \times 10^5$ cm$^{-2}$ in average.

Example 4

The composite substrate was produced according to the same procedure as the Example 1. However, different from the Example 1, the width WG of the groove was made 150 μm, the width of the seed crystal layer was made 200 μm, and the period of arrangement of the grooves was made 350 μm. As a result, it was obtained colorless and transparent gallium nitride crystal layer having thicknesses of 365 μm at the mountain part and 211 μm at the valley part of the bellow shape.

It was subjected to polishing and its surface was observed by a microscope to prove that voids were not generated on the polished surface. Further, the in-plane distribution of the dislocation density was measured by CL to prove to be 6 to $15 \times 10^5$ cm$^{-2}$ in average. Further, the amount of growth was considerably observed until the completion of the association in the valley parts.

Example 5

The composite substrate was produced according to the same procedure as the Example 1. However, different from the Example 1, the width WG of the groove was made 30 μm, the width of the seed crystal layer was made 2500 μm, and the period of arrangement of the grooves was made 2530 μm. As a result, it was obtained colorless and transparent gallium nitride crystal layer having thicknesses of 2380 μm at the mountain part and 200 μm at the valley part of the bellow shape.

It was subjected to polishing and its surface was observed by a microscope to prove that voids were not generated on the polished surface. Further, the in-plane distribution of the dislocation density was measured by CL to prove to be 20 to $40 \times 10^5$ cm$^{-2}$ in average. That is, the dislocation density was slightly increased.

(Applications)

The present invention may be used in applications requiring high quality, such as a white LED with improved color rendering index and called a post-fluorescent lamp, a blue-violet laser disk for a high-speed and high-density optical memory, and a power device for an inverter for a hybrid car or the like.

The invention claimed is:

1. A composite substrate comprising a seed crystal substrate and a layer of a crystal of a nitride of a group 13 element grown on said seed crystal substrate, said seed crystal substrate comprising a base body comprising a growth face of a (11-22) plane and a plurality of rows of stripe-shaped seed crystal layers formed on said base body:
   wherein each seed crystal layer comprises an upper face and a side face;
   wherein said upper face of each seed crystal layer is (11-22) plane;
   wherein a groove is formed between said seed crystal layers adjacent to each other;
   wherein said side face faces said groove and is of m-plane;
   wherein a longitudinal direction of said groove is a direction in which a c-axis of a crystal forming each seed crystal layer is projected on said upper face; and
   wherein said seed crystal layers are formed on said growth face of a (11-22) plane of said base body.

2. The composite substrate of claim 1, wherein a plurality of said seed crystal layers are separated from each other.

3. The composite substrate of claim 1, wherein said seed crystal layer comprises gallium nitride single crystal.

4. The composite substrate of claim 1, wherein said layer of said crystal of said nitride of said group 13 element comprises gallium nitride crystal.

5. The composite substrate of claim 1, wherein said layer of said crystal of said nitride of said group 13 element is polished.

6. A functional device comprising said composite substrate of claim 1, and a functional layer comprising a nitride of a group 13 element and formed on said layer of said crystal of said nitride of said group 13 element by vapor phase method.

7. The functional device of claim 6, wherein said functional layer has a function of emitting light.

8. A seed crystal substrate comprising a base body comprising a growth face of a (11-22) plane and a plurality of rows of stripe-shaped seed crystal layers formed on said base body:
   wherein each seed crystal layer comprises an upper face and a side face;
   wherein said upper face of each seed crystal layer is (11-22) plane;
   wherein a groove is formed between said seed crystal layers adjacent to each other;
   wherein said side face faces said groove and is of m-plane;
   wherein a longitudinal direction of said groove is a direction in which a c-axis of a crystal forming each seed crystal layer is projected on said upper face; and
   wherein said seed crystal layers are formed on said growth face of a (11-22) plane of said base body.

9. The seed crystal substrate of claim 8, wherein a plurality of said seed crystal layers are separated from each other.

10. The seed crystal substrate of claim 8, wherein said seed crystal layer comprises gallium nitride single crystal.

* * * * *